United States Patent
Park et al.

(10) Patent No.: US 12,405,177 B2
(45) Date of Patent: Sep. 2, 2025

(54) ELECTRODE STRUCTURE FOR HIGH-SENSITIVITY PROTRUSION-TYPE PRESSURE SENSOR AND METHOD FOR MANUFACTURING THE SAME

(71) Applicant: Industry-Academic Cooperation Foundation, Yonsei University, Seoul (KR)

(72) Inventors: Jin-woo Park, Seoul (KR); Soyeon Lee, Seoul (KR); Seung-Rok Kim, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 396 days.

(21) Appl. No.: 18/064,502

(22) Filed: Dec. 12, 2022

(65) Prior Publication Data
US 2023/0204438 A1    Jun. 29, 2023

(30) Foreign Application Priority Data

Dec. 23, 2021 (KR) .................. 10-2021-0186115

(51) Int. Cl.
*G01L 1/16* (2006.01)
*G01L 1/14* (2006.01)
(Continued)

(52) U.S. Cl.
CPC .............. *G01L 1/16* (2013.01); *H01B 1/02* (2013.01); *H01B 13/0013* (2013.01);
(Continued)

(58) Field of Classification Search
CPC . G01L 1/16; G01L 1/146; G01L 1/205; G01L 1/14; H01B 1/02; H01B 13/0013;
(Continued)

(56) References Cited

U.S. PATENT DOCUMENTS

| | | | |
|---|---|---|---|
| 10,876,906 B2 | 12/2020 | Yoon et al. | |
| 11,545,914 B2 | 1/2023 | Song | |

(Continued)

FOREIGN PATENT DOCUMENTS

| | | |
|---|---|---|
| JP | 2013064681 A | 4/2013 |
| JP | 201643581 A | 4/2016 |

(Continued)

OTHER PUBLICATIONS

Lee, Soyeon, "Continuous, low-level pressure sensor enabled by electrostatic induction in triboelectric nanogenerator"; Laboratory for Materials Interfaces (LMI), Department of Materials Science and Engineering Yonsei University, Seoul, Korea. Presented: Apr. 20, 2021; 13 pages.

(Continued)

*Primary Examiner* — Peter J Macchiarolo
*Assistant Examiner* — John M Royston
(74) *Attorney, Agent, or Firm* — DICKINSON WRIGHT PLLC

(57) ABSTRACT

Provided are an electrode structural body for a highly sensitive protrusion type pressure sensor and a method for manufacturing the same. According to the electrode structural body of the present invention, an electrode is formed along a protruding structure, so that deformation of the protruding structure may be sufficiently sensed to achieve high sensitivity even in a low pressure range and a polymer layer may be further introduced to the outside of the electrode to achieve excellent stability.

6 Claims, 8 Drawing Sheets

(51) Int. Cl.
    *G01L 1/20*       (2006.01)
    *H01B 1/02*       (2006.01)
    *H01B 1/12*       (2006.01)
    *H01B 13/00*     (2006.01)
    *H10D 48/50*     (2025.01)

(52) U.S. Cl.
    CPC ..... *H01B 13/0016* (2013.01); *H01B 13/0026* (2013.01); *G01L 1/14* (2013.01); *G01L 1/146* (2013.01); *G01L 1/205* (2013.01); *H01B 1/12* (2013.01); *H10D 48/50* (2025.01)

(58) Field of Classification Search
    CPC .. H01B 13/0016; H01B 13/0026; H01B 1/12; H10D 48/50
    USPC ......................................................... 73/724
    See application file for complete search history.

(56) References Cited

U.S. PATENT DOCUMENTS

| | | | |
|---|---|---|---|
| 2011/0263036 A1* | 10/2011 | Blauw | G01N 27/4146 257/E29.166 |
| 2018/0150138 A1* | 5/2018 | Kim | G06F 3/016 |
| 2018/0266898 A1 | 9/2018 | Yoon et al. | |
| 2020/0343829 A1 | 10/2020 | Song | |
| 2023/0123778 A1 | 4/2023 | Song | |

FOREIGN PATENT DOCUMENTS

| | | |
|---|---|---|
| KR | 20180047432 A | 5/2018 |
| KR | 20180106216 A | 10/2018 |
| KR | 20190058941 A | 5/2019 |
| KR | 20190110795 A | 10/2019 |

OTHER PUBLICATIONS

Lee, Soyeon, "Continuous, Low-Level Pressure Sensor Enabled by a Convolution of Electrostatic Induction in Triboelectric Nanogenerator", Materials Research Society (MRS); 2021 Virtual MRS Spring Meeting & Exhibit Apr. 17-23, 2021, 2 pages.

* cited by examiner

ELECTRODE STRUCTURE FOR HIGH-SENSITIVITY PROTRUSION-TYPE PRESSURE SENSOR AND METHOD FOR MANUFACTURING THE SAME

CROSS-REFERENCE TO RELATED APPLICATIONS

This application claims priority to and the benefit of Korean Patent Application No. 10-2021-0186115, filed on Dec. 23, 2021, in the Korean Intellectual Property Office, the disclosure of which is incorporated herein by reference in its entirety.

TECHNICAL FIELD

The following disclosure relates to an electrode structural body for a highly sensitive protrusion type pressure sensor and a method for manufacturing the same.

BACKGROUND

The statements in this section merely provide background information related to the present disclosure and may not constitute prior art.

Pressure stimulation has a large spectrum ranging from a very small sound to a fluid flow in the air, pulses in the body, touch, steps, and the like. Among them, in order to sense pressure stimulation having a small vibration range occurring inside/outside the human body to predict non-ideal signs in the body or obtain information from the outside, a small pressure sensor having high sensitivity in a wearable form is needed.

These kinds of pressure sensors include a pressure resistance type and a capacitance type consuming electric power, a self-powered type of friction power generation consuming no electric power, and a piezoelectric type. These have principles and characteristics different from each other, and in the pressure resistance type, the capacitance type, and the friction power generation type pressure sensors, a strategy in which a protruding structure is introduced for sensitively outputting an electrical signal even under small pressure, so that each of change in contact resistance, change in permittivity, and change in the area of a friction surface is maximized to increase sensitivity and a sensing range, is implemented.

However, since the position of an active material of a device showing a change and an electrode sensing the change are far apart, the advantage of the protruding structure may not be sufficiently used, and thus, it is still difficult to achieve high sensitivity in a low pressure range. In addition, in forming a protruding structure, since in most cases, a Si wafer is etched and used as a mold, a protruding structure implemented in the conventional study is limited to spherical, pyramid, and cylindrical shapes, and thus, there is limitation in variously implementing suitable structures required depending on the kind of pressure stimulation.

SUMMARY

An embodiment of the present invention is directed to providing an electrode structural body in which an electrode is formed along a protruding structure, so that deformation of the protruding structure may be sufficiently sensed to achieve high sensitivity even in a low pressure range and a polymer layer may be further introduced to the outside of the electrode to achieve excellent stability, and a method for manufacturing the same.

In one general aspect, an electrode structural body includes: a substrate including two or more protruding portions including a first polymer; and an electrode layer conformally positioned along a surface of the protruding portion.

In the electrode structural body of the present invention, a spacing between the protruding portions adjacent to each other may be 100 μm or more.

In the electrode structural body of the present invention, the electrode layer may be selected from the group consisting of conductive one-dimensional metal materials, conductive one-dimensional carbon material, conductive two-dimensional metal materials, conductive two-dimensional carbon materials, and conductive polymers, and the electrode layer may include metal nanowires.

In the electrode structural body of the present invention, a surface layer including a second polymer may be positioned sequentially on the electrode layer, and the electrode layer is embedded in the surface layer so that it is not exposed to the outside.

In another general aspect, a method for manufacturing an electrode layer includes: (a) depositing a metal on a mold including two or more concave well portions to manufacture a metal coated mold; and (b) forming a substrate including two or more protruding portions which are bonded to the metal coated mold and include a first polymer and an electrode layer conformally positioned along a surface of the protruding portion.

In the method for manufacturing an electrode structural body of the present invention, the method may be selected from the group consisting of aluminum, platinum, and an indium tin oxide.

In the method for manufacturing an electrode structural body of the present invention, the electrode layer may be manufactured by spraying a conductive material selected from the group consisting of conductive one-dimensional metal materials, conductive one-dimensional carbon material, conductive two-dimensional metal materials, conductive two-dimensional carbon materials, and conductive polymers; and heat-treating the sprayed conductive material.

In the method for manufacturing an electrode structural body of the present invention, (b) may include: (b-1) forming an electrode layer in the metal coated mold; (b-2) coating the metal coated mold having the electrode layer formed thereon with a solution including the first polymer; (b-3) curing the solution including the first polymer to form a substrate including two or more protruding portions and an electrode layer conformally positioned along a surface of the protruding portion; and (b-4) separating the metal coated mold and the substrate, wherein the first polymer may be a siloxane-based polymer.

In the method for manufacturing an electrode structural body of the present invention, (b) may include: (b-1) coating the metal coated mold with a solution including the first polymer; (b-2) curing the solution including the first polymer to form a substrate including two or more protruding portions; and (b-3) forming an electrode layer conformally positioned along surfaces of the two or more protruding portions of the substrate, wherein the first polymer may be a PVDF-based polymer, and a thickness of the substrate is adjusted depending on an amount of the solution including the first polymer to adjust the position of an indwelling electrode.

In the method for manufacturing an electrode structural body of the present invention, after (b), (c) forming a surface layer including a second polymer on the two or more protruding portions of the substrate may be included, wherein the second polymer may be the same as the first polymer.

In still another general aspect, a pressure sensor includes the electrode structural body.

In the pressure sensor of the present invention, when the pressure sensor is used as a friction power generation type pressure sensor, an amount of change in power generation voltage depending on a displacement of the pressure sensor moved by pressure may be 2 V/mm or more.

Other features and aspects will be apparent from the following detailed description, the drawings, and the claims.

BRIEF DESCRIPTION OF THE DRAWINGS

In order that the disclosure may be well understood, there will not be described various forms thereof, given by example, reference being made to the accompanying drawings, in which.

DETAILED DESCRIPTION

Figure 1:
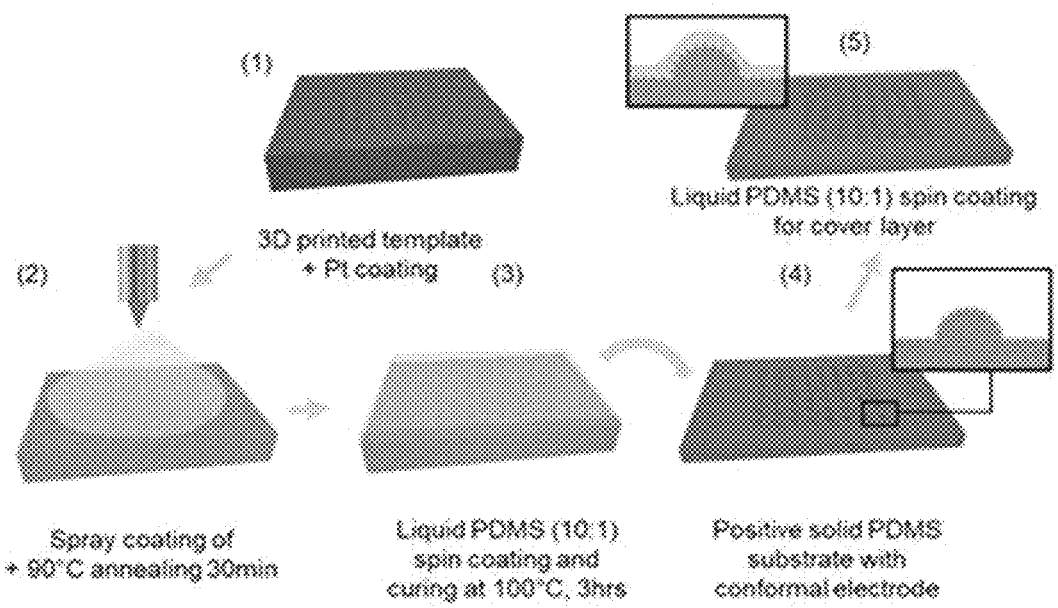
FIG. 1 is a drawing schematically showing a method for manufacturing an electrode structural body according to Example 2.

Hereinafter, the electrode structural body of the present invention will be described in detail with reference to the accompanying drawing.

The drawings to be provided below are provided by way of example so that the spirit of the present invention can be sufficiently transferred to a person skilled in the art to which the present invention pertains. Therefore, the present invention is not limited to the drawings provided below but may be embodied in many different forms, and the drawings suggested below may be exaggerated in order to clear the spirit of the present invention.

Technical terms and scientific terms used herein have the general meaning understood by those skilled in the art to which the present invention pertains, unless otherwise defined, and the description for the known function and configuration which may unnecessarily obscure the gist of the present invention will be omitted in the following description and the accompanying drawings.

In addition, the singular form used in the specification and claims appended thereto may be intended to include a plural form also, unless otherwise indicated in the context.

In the present specification and the appended claims, the terms such as "first" and "second" are not used in a limited meaning but are used for the purpose of distinguishing one constituent element from other constituent elements.

In the present specification and the appended claims, the terms such "comprise" or "have" mean that there is a characteristic or a constituent element described in the specification, and as long as it is not particularly limited, a possibility of adding one or more other characteristics or constituent elements is not excluded in advance.

In the present specification and the appended claims, when a portion such as a membrane (layer), a region, and a constituent element is present on another portion, not only a case in which the portion is in contact with and directly on another portion but also a case in which other membranes (layers), other regions, other constitutional elements are interposed between the portions is included.

The electrode structural body of the present invention is characterized by including: a substrate including two or more protruding portions including a first polymer; and an electrode layer conformally positioned along a surface of the protruding portion.

A general electrode structural body is used only for a pressure resistance type or capacitance type pressure sensor consuming electric power, but the electrode structural body according to a specific example of the present invention may be used for a self-powered pressure sensor of a self-powered type consuming no electric power as well as the pressure resistance type or capacitance type pressure sensor, so that a friction electrification value is transferred well by the deformation of an electrode to improve pressure sensitivity. In addition, since a substrate and an electrode layer form a composite by embedding, the electrode layer may be physically and chemically stably manufactured without being released from the substrate.

In a specific example, the first polymer may be a polymer having excellent adhesive strength to the electrode layer, preferably, may be an elastomer-based polymer, and more preferably, may be selected from the group consisting of silicon-based polymers, epoxy polymers, and urethane polymers. A non-limiting example of the first polymer may include: polyacrylate rubber (ACM), ethylene acrylic rubber (AEM), polyester urethane (AU), butadiene rubber (BR), chloroprene (or neoprene) rubber (CR), chlorosulfonated polyethylene (CSM), ethylene oxide epichlorohydrin rubber (ECO), ethylene propylene diene rubber (EPDM), polyether urethane (EU), perfluoroelastomer (FFKM), fluorocarbon rubber (FKM), fluorosilicone rubber (FVMQ), hydrogenated nitrile butadiene rubber (HNBR), isoprene rubber (IR), butyl rubber (IIR), nitrile butadiene rubber (NBR), natural rubber (NR), polydimethylsiloxane (PDMS), styrene butadiene rubber (SBR), polybutadiene (PB), polyurethane (PU), polyurethane acrylate (PUA), polyvinylidene fluoride (PVDF), poly(vinylidenefluoride-co-trifluoroethylene) (PVDF-TrFE), silicone rubber (VMQ), and the like, and preferably PDMS or PVDF-TrFE.

In a specific example, the structure of the protruding portion may be various shapes such as cylinder, conical, hemispherical, polygonal column, and polygonal pyramid shapes, and preferably a hemispherical shape.

In a specific example, the protruding portion may have a diameter of 500 µm or more, preferably 500 to 2,000 µm, more preferably 600 to 1,600 µm, and still more preferably 700 to 1,200 µm. In addition, the protruding portion may have a height of 500 µm or more, preferably 500 to 2,000 µm, more preferably 600 to 1,600 µm, and still more preferably 700 to 1,200 µm. Therefore, a ratio between diameter and height in a surface where the protrusion is in contact with the substrate may be 1:0.1 to 1:10, preferably 1:0.2 to 1:5, and more preferably 1:0.5 to 1:2.

In a specific example, a spacing between the protruding portions may be 100 µm or more, preferably 100 to 1,000 µm, more preferably 150 to 750 µm, and still more preferably 200 to 500 µm. The electrode structural body manufactured by a common manufacturing method of an electrode structural body may be manufactured into a structure of a small unit ranging from several nanometers to several micrometers, but the electrode structural body according to a specific example of the present invention may be manufactured into a structure of a large unit.

In a specific example, an elastic modulus of the first polymer may be 1 to 1,000 MPa or more, preferably 1 to 100 MPa, and more preferably 1 to 10 MPa. When the elastic modulus in the above range is satisfied, the sensitivity of a pressure sensor, detection limitation, and a detectable pressure range are excellent.

In a specific example, the electrode layer may be selected from the group consisting of conductive one-dimensional metal materials, conductive one-dimensional carbon materials, conductive two-dimensional metal materials, conductive two-dimensional carbon materials, and conductive polymers, preferably, may be selected from the group consisting of metal nanowires, metal nanotubes, metal nanoparticles, carbon nanowires, carbon nanotubes, carbon nanoparticles, graphene, and PEDOT:PSS, and more preferably, may be metal nanowires. A non-limiting example of the metal included in the metal nanowires, metal nanotubes, or metal nanoparticles may be silver (Ag), platinum (Pt), ruthenium (Ru), rhodium (Rh), molybdenum (Mo), osmium (Os), iridium (Ir), rhenium (Re), palladium (Pd), vanadium (V), tungsten (W), cobalt (Co), iron (Fe), selenium (Se), nickel (Ni), bismuth (Bi), tin (Sn), chromium (Cr), titanium (Ti), gold (Au), cerium (Ce), copper (Cu), and the like, and preferably, may be silver or copper.

In a specific example, the thickness of the electrode layer may vary depending on the amount to be spray coated, and may be 0.5 to 5 µm, preferably 1 to 2 µm. When the thickness of the electrode layer in the above range is satisfied, it is easy to embed the first polymer, it is easy to manufacture a conformal contact type electrode, the sensitivity of the pressure sensor is maintained, and the breakage of the electrode layer may be prevented.

In a specific example, a surface layer including a second polymer may be positioned sequentially on the electrode layer, and the electrode layer is embedded in the surface layer so that it is not exposed to the outside.

In the friction power generation type pressure sensor, since the electrical properties (such as charge amount and charge density) of a surface in contact as well as the structural body are reflected, an exposed electrode has one kind of charging characteristics as a conductor, and since the surface layer including the second polymer is positioned on the electrode layer, tunability may be given to a paired electrode structure and a single electrode structure based on various types of charging pairs. That is, by adjusting the surface layer in the friction power generation type pressure sensor, it may be adjusted to get the highest electrical output when human skin is touched, or the highest output may be produced in a structure in contact with clothes such as fabrics.

In a specific example, the second polymer may be the same polymer as the first polymer. By depositing the second polymer on the electrode layer, the sensitivity of the pressure sensor is maintained and the moving or breakage of the electrode layer is prevented, so that the stability of the pressure sensor is excellent.

In a specific example, the thickness of the surface layer including the second polymer may have a ratio of 1/10 to 1/100, preferably 1/50 to 1/100 to the diameter of the protruding portion, When the thickness of the surface layer in the above range is satisfied, the shape of the structural body is well reflected, so that the sensitivity of the pressure sensor is maintained and the breakage of the electrode layer may be prevented.

In addition, the depth from the outermost part of the surface layer to the electrode layer may be 10 to 30 µm, preferably 10 to 25 µm, and most preferably 10 to 20 µm, but the depth may be adjusted depending on the conditions of forming the surface layer of (c).

The manufacturing method of the electrode structural body of the present invention is characterized by including: (a) depositing a metal on a mold including two or more concave well portions to manufacture a metal coated mold; and (b) forming a substrate including two or more protruding portions which are bonded to the metal coated mold and include a first polymer and an electrode layer conformally positioned along a surface of the protruding portion.

A general method for manufacturing an electrode structural body is a silicon etching method, but since a pattern is manufactured using materials from nature as a mold, the pattern is limited to a specific shape. In addition, the electrode layer is coated on an already formed electrode structural body, as friction proceeds, the electrode layer is released, so that the electrode is unstable and is not mechanically flexible. However, according to the method for manufacturing an electrode structural body according to a specific example of the present invention, since the mold may be manufactured using 3D printing, various shapes of the electrode structural body may be manufactured, and since the electrode structural body may be manufactured by an embedding method, the electrode structural body may be mechanically and chemically stable.

In a specific example, in (a), metal may be deposited on a mold to manufacture a metal coated mold, and the non-limiting example of the metal may be aluminum (Al), gallium (Ga), indium (In), titanium (Ti), platinum (Pt), gold (Au), silver (Ag), an indium tin oxide (TIO), and the like, preferably aluminum, platinum, and an indium tin oxide, and most preferably platinum. The mold may be formed of a photocurable polymer, and the photocurable polymer is cured by receiving light and forming a bond between monomers, and here, the curing of the elastic polymer-based polymer forming the first polymer may be inhibited by the monomer which is not completely cured in the photocurable polymer forming the mold. Thus, when the layer including the metal is used, a problem of inhibiting curing of the first polymer is prevented, and the damage of the substrate including the electrode layer and the first polymer may be prevented after the release of the mold.

In a specific example, the electrode layer may be manufactured by spraying a conductive material selected from the group consisting of conductive one-dimensional metal materials, conductive one-dimensional carbon material, conductive two-dimensional metal materials, conductive two-dimensional carbon materials, and conductive polymers; and heat-treating the sprayed conductive material.

In a specific example, (b) may include: (b-1) forming an electrode layer in the metal coated mold; (b-2) coating the metal coated mold having the electrode layer formed thereon with a solution including the first polymer; (b-3) curing the solution including the first polymer to form a substrate including two or more protruding portions and an electrode layer conformally positioned along a surface of the protruding portion; and (b-4) separating the metal coated mold and the substrate.

In a specific example, the forming of an electrode layer in (B-1) may be formed by spray coating. The spray coating may be a step of forming an electrode layer by spraying an electrode material in the form of being mixed with a solvent using compressed gas. The electrode material in the form of being mixed with a solvent at a temperature higher than the boiling point of the solvent is sprayed, so that the solvent selectively evaporates and only the electrode material remains to form the electrode layer.

The electrode material may be selected from the group consisting of conductive one-dimensional metal materials, conductive one-dimensional carbon materials, conductive two-dimensional metal materials, conductive two-dimensional carbon materials, and conductive polymers, preferably, may be selected from the group consisting of metal nanowires, metal nanotubes, metal nanoparticles, carbon nanowires, carbon nanotubes, carbon nanoparticles, graphene, and PEDOT:PSS, and more preferably, may be metal nanowires. A non-limiting example of the metal included in the metal nanowires, metal nanotubes, or metal nanoparticles may be silver (Ag), platinum (Pt), ruthenium (Ru), rhodium (Rh), molybdenum (Mo), osmium (Os), iridium (Ir), rhenium (Re), palladium (Pd), vanadium (V), tungsten (W), cobalt (Co), iron (Fe), selenium (Se), nickel (Ni), bismuth (Bi), tin (Sn), chromium (Cr), titanium (Ti), gold (Au), cerium (Ce), copper (Cu), and the like, and preferably, may be silver or copper.

In a specific example, the first polymer of (b-2) may be an elastic polymer-based polymer, and preferably may be a siloxane-based polymer. The elasticity of the indwelling electrode structural body may be improved by using the elastic polymer-based polymer.

In (b-2), the coating of a solution including the first polymer may be performed by spin coating or drop casting. When the conditions are satisfied, the moving or breakage of the electrode layer may be prevented, and the solution including the first polymer and the electrode layer are not released, so that the stability of the pressure sensor is excellent.

In a specific example, the curing of the solution including the first polymer in (b-3) may be performed by a method commonly used in curing the elastic polymer. As an example, it may be performed by thermal curing at a high temperature, curing at room temperature, UV curing, ultrasonic curing, and the like, and preferably, may be cured by thermal curing at a high temperature. Here, the solution may be cured at 100 to 200° C., preferably 120 to 180° C. for 1 minute to 2 hours, preferably 10 minutes to 1 hour. Since the curing is performed in the temperature and time ranges, the solution may be cured at a high temperature for a short period of time, so that the penetration of the elastomer inside a metal-deposited 3D printed mold may be prevented.

In a specific example, (b) may include: (b-1) coating the metal coated mold with a solution including the first polymer; (b-2) curing the solution including the first polymer to form a substrate including two or more protruding portions; and (b-3) forming an electrode layer conformally positioned along surfaces of two or more protruding portions of the substrate.

In a specific example, the first polymer of (b-1) may not be an elastomer-based polymer, preferably, may be a PVDF-based polymer, and more preferably, may be a PVDF-TrFE.

In the coating of a solution including the first polymer in (b-1), a solution in which the first polymer is dissolved may be used, and the coating may be performed by spin coating or drop casting. Here, the thickness of the substrate is adjusted depending on the amount of the solution in which the first polymer is dissolved, thereby adjusting the position of the indwelling electrode. The concentration of the solution may be 1 to 20 wt %, preferably 5 to 15 wt %, and the amount of the solution may be 100 to 2,000 mg, preferably 200 to 1,800 mg, and most preferably 300 to 1,600 mg. When the solution is used at the concentration and the amount, the position of the indwelling electrode is adjusted, so that it may be easily adjusted at what pressure the most sensitive reaction is produced.

In a specific example, in the heating of the solution including the first polymer in (b-2), the solution may be heated to 100° C. or lower, preferably to 60 to 100° C. for 1 to 5 hours, preferably 1.5 to 3 hours. Since the heating is performed in the temperature and the time ranges, the polymer remaining after the solvent included in the solution evaporates forms the film at the boiling point of the solvent or a temperature lower than the boiling point.

In a specific example, the forming of an electrode layer in (B-3) may be formed by spray coating. The spray coating may be a step of forming an electrode layer by spraying an electrode material in the form of being mixed with a solvent using compressed gas. The electrode material in the form of being mixed with a solvent at a temperature higher than the boiling point of the solvent is sprayed, so that the solvent selectively evaporates and only the electrode material remains to form the electrode layer.

The electrode material may be selected from the group consisting of conductive one-dimensional metal materials, conductive one-dimensional carbon materials, conductive two-dimensional metal materials, conductive two-dimensional carbon materials, and conductive polymers, preferably, may be selected from the group consisting of metal nanowires, metal nanotubes, metal nanoparticles, carbon nanowires, carbon nanotubes, carbon nanoparticles, graphene, and PEDOT:PSS, and more preferably, may be metal nanowires. A non-limiting example of the metal included in the metal nanowires, metal nanotubes, or metal nanoparticles may be silver (Ag), platinum (Pt), ruthenium (Ru), rhodium (Rh), molybdenum (Mo), osmium (Os), iridium (Ir), rhenium (Re), palladium (Pd), vanadium (V), tungsten (W), cobalt (Co), iron (Fe), selenium (Se), nickel (Ni), bismuth (Bi), tin (Sn), chromium (Cr), titanium (Ti), gold (Au), cerium (Ce), copper (Cu), and the like, and preferably, may be silver or copper.

In a specific example, after (b), (c) forming a surface layer including a second polymer on the two or more protruding portions of the substrate may be further included, and the forming of the surface layer may be performed by spin coating or drop casting. In the friction power generation type pressure sensor, since the electrical properties (such as charge amount and charge density) of a surface in contact as well as the structural body are reflected, an exposed electrode has one kind of charging characteristics as a conductor, and since the surface layer including the second polymer is positioned on the electrode layer, tunability may be given to a paired electrode structure and a single electrode structure based on various types of charging pairs. That is, by adjusting the surface layer in the friction power generation type pressure sensor, it may be adjusted to get the highest electrical output when human skin is touched, or the highest output may be produced in a structure in contact with clothes such as fabrics.

The present invention provides the electrode structural body and a pressure sensor including the electrode structural body manufactured by the method for manufacturing an electrode structural body.

In a specific example, when the pressure sensor is used as a friction power generation type pressure sensor, the pressure sensor is moved by pressure and voltage is generated by the electrode layer depending on a displacement of the pressure sensor moved, in which the amount of change in generated voltage depending on the displacement of the pressure sensor moved may be 2 V/mm or more, preferably 2 to 10 V/mm, and more preferably 2 to 5 V/mm.

In a specific example, when the pressure sensor is used as a capacitance type pressure sensor, the pressure sensor is moved by pressure and a capacitance is generated by the electrode layer depending on the displacement of the pressure sensor moved, in which the amount of change in the capacitance depending on the displacement of the pressure sensor moved may be 1 F/mm or more, preferably 1 to 10 F/mm, and more preferably 1 to 5 F/mm.

Hereinafter, the present invention will be described in detail by the examples. However, the examples are for describing the present invention in more detail, and the scope of the present invention is not limited to the following examples.

<Example 1> Manufacture of Exposed Electrode Structural Body Including PDMS Polymer First, platinum (Pt) was deposited on a 3D printed mold using a high temperature resin with ion plasma equipment. Thereafter, 0.31 wt % (in ethanol) of nanowires (AgNW) was sprayed with a spray gun, and a heat treatment was performed at 100° C. for 30 minutes. Thereafter, PDMS was mixed with a curing agent at 10:1, and spin coated at a speed of 1000 rpm for 30 seconds, and then a speed of 500 rpm for 30 seconds. At this time, the spin coating conditions were able to be added or subtracted depending on the final thickness to be desired. Thereafter, the sample was heat-treated at 160° C. for 2 hours. Next, the sample was immersed in water, and when the mold was detached, PDMS having an embossed structural body was able to be confirmed.

<Example 2> Manufacture of Indwelling Electrode Structural Body Including PDMS Polymer The manufacture was performed by mixing PDMS with a curing agent at 10:1 and spin-coating it on the exposed electrode structural body manufactured in Example 1.

A specific manufacturing method is shown in FIG. 1.

<Example 3> Manufacture of Indwelling Electrode Structural Body Including PVDF-TrFE Polymer First, platinum (Pt) was deposited on a 3D printed mold using a high temperature resin with ion plasma equipment. A PVDF-TrFE solution was spin coated or drop cast on the mold, and the solvent was evaporated by an additional heat treatment, so that a thin PVDF-TrFE layer remained on the mold. AgNW was spray coated on the PVDF-TrFE/mold, the PVDF-TrFE/solution was coated again, the solvent was evaporated by the heat treatment, and the mold was removed to manufacture a film having an indwelling electrode formed.

Figure 2:
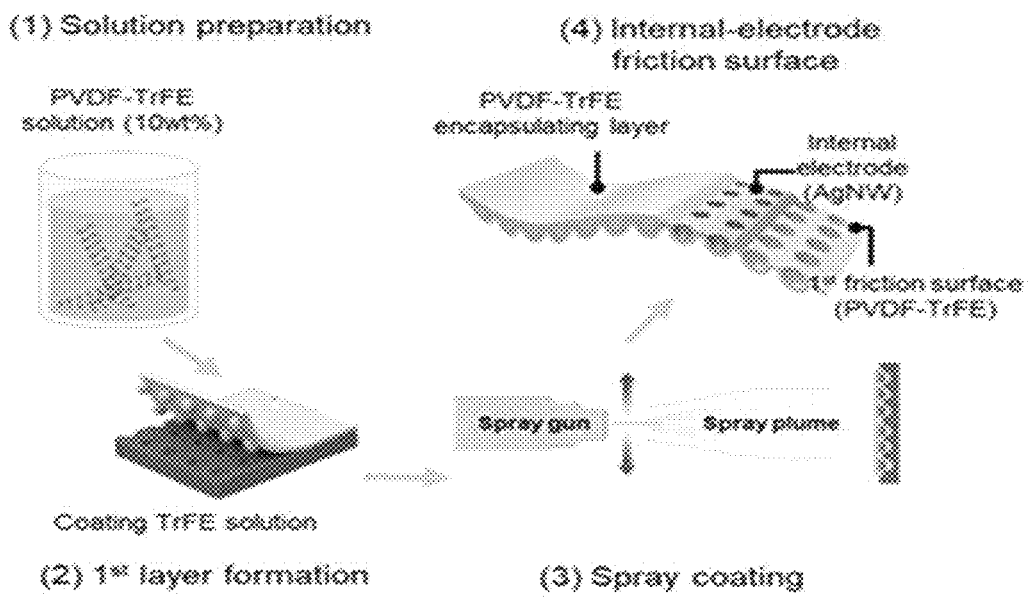
FIG. 2 is a drawing schematically showing a method for manufacturing an electrode structural body according to Example 3.

A specific manufacturing method is shown in FIG. 2.

<Comparative Example 1> Electrode not Formed Along Protruding Structure

A metal-coated 3D printed mold was spin coated with a mixture of PDMS and a curing agent at 10:1, and then the electrode layer was spray coated, and was covered with PDMS again, so that an electrode was formed on an opposite flat portion of the structural body.

<Experimental Example 1> Analysis of Structure of Electrode Structural Body

First, the structure of the exposed electrode structural body according to Example 1 of the present invention was observed by SEM.

Figure 3:
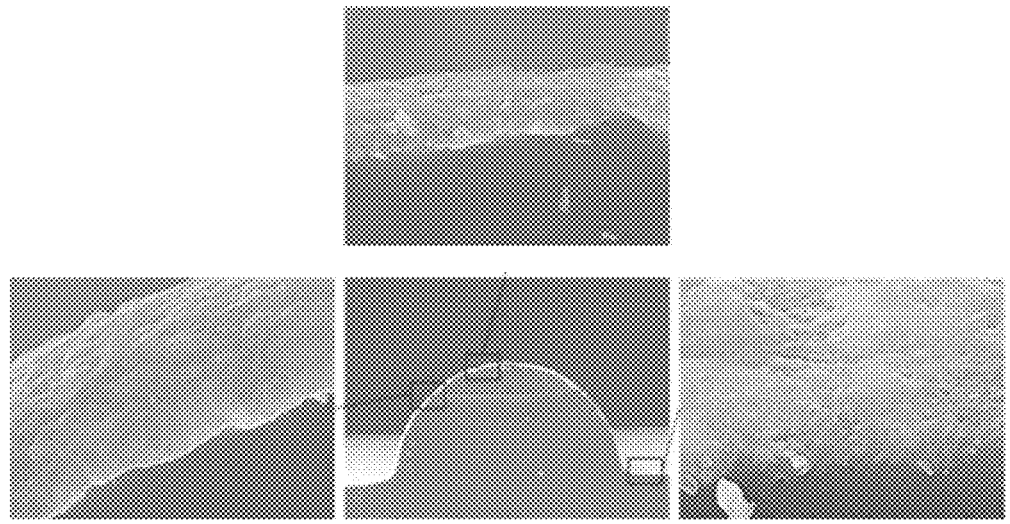
FIG. 3 is a drawing in which an electrode structural body according to Example 1 is observed by SEM.

Referring to FIG. 3, it was confirmed that a silver nanowire electrode layer was formed along the surface of a spherical protrusion. The diameter of the protruding structure was about 400 μm, and the thickness of the silver nanowire electrode layer was about 1 μm.

Next, the structure of the indwelling electrode structural body according to Example 2 was observed by SEM.

Figure 4:
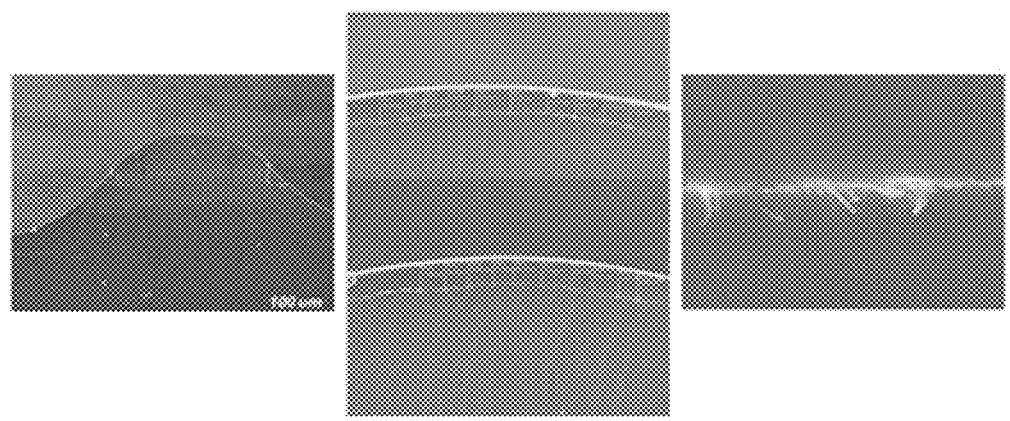
FIG. 4 is a drawing in which an electrode structural body according to Example 2 is observed by SEM.
Figure 5:
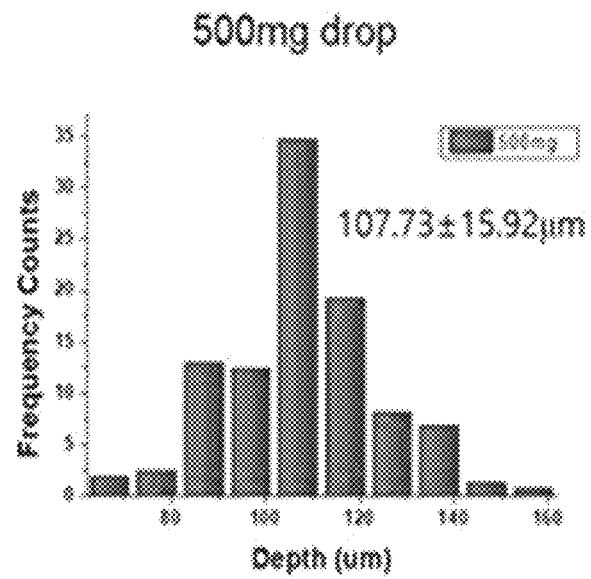
FIGS. 5 to 8 are graphs in which positions of an electrode depending on the amount of a polymer solution are observed in the electrode structural body according to Example 3.
Figure 6:
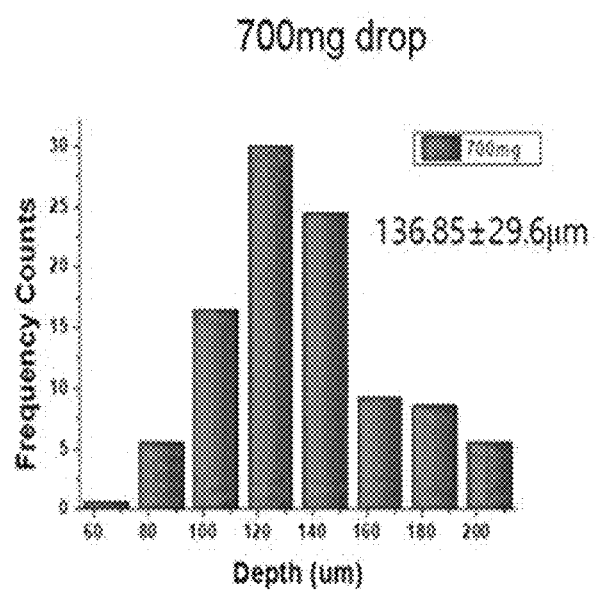
Figure 7:
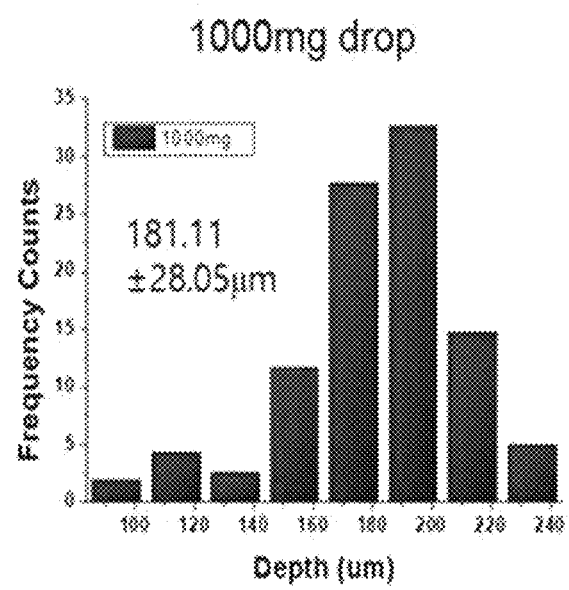
Figure 8:
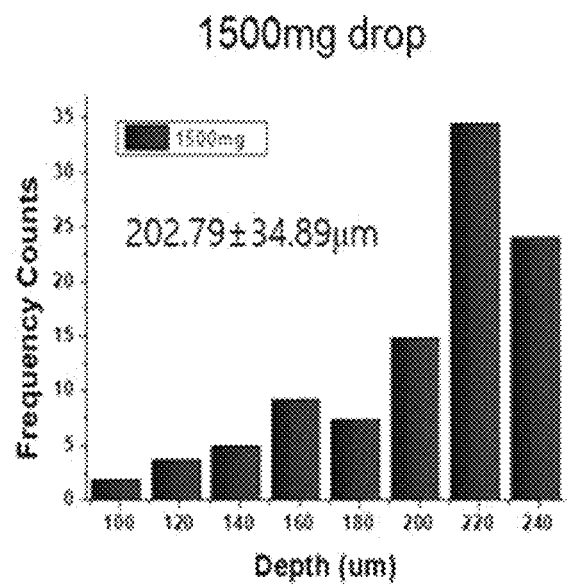

Referring to FIG. 4, it was confirmed that the electrode layer was in a nanowire form, a polymer layer was formed on the electrode layer, and the thickness of the polymer layer was about 13 to 18 μm.

Next, in the indwelling electrode structural body according to Example 3 of the present invention, the position of the indwelling electrode depending on the amount of the PVDF-TrFE solution was observed.

Referring to FIGS. 5 to 8, it was confirmed that as the amounts of the PVDF-TrFE solution were increased to 500, 700, 1,000, and 1,500 mg, the position of the indwelling electrode was increased to 107.73, 136.85, 181.11, 202.79 μm. That is, it was confirmed that the position of the indwelling electrode was able to be adjusted by adjusting the amount of the PVDF-TrFE solution, and specifically, as the amount of the PVDF-TrFE solution was increased, the indwelling electrode was positioned deeper.

<Experimental Example 2> Analysis of Stability of Electrode Structural Body

In order to evaluate the mechanical and chemical stability of the exposed electrode structural body according to Example 1 of the present invention, the sensitivity of a sensor when constant stimulation was applied was observed.

Figure 9:
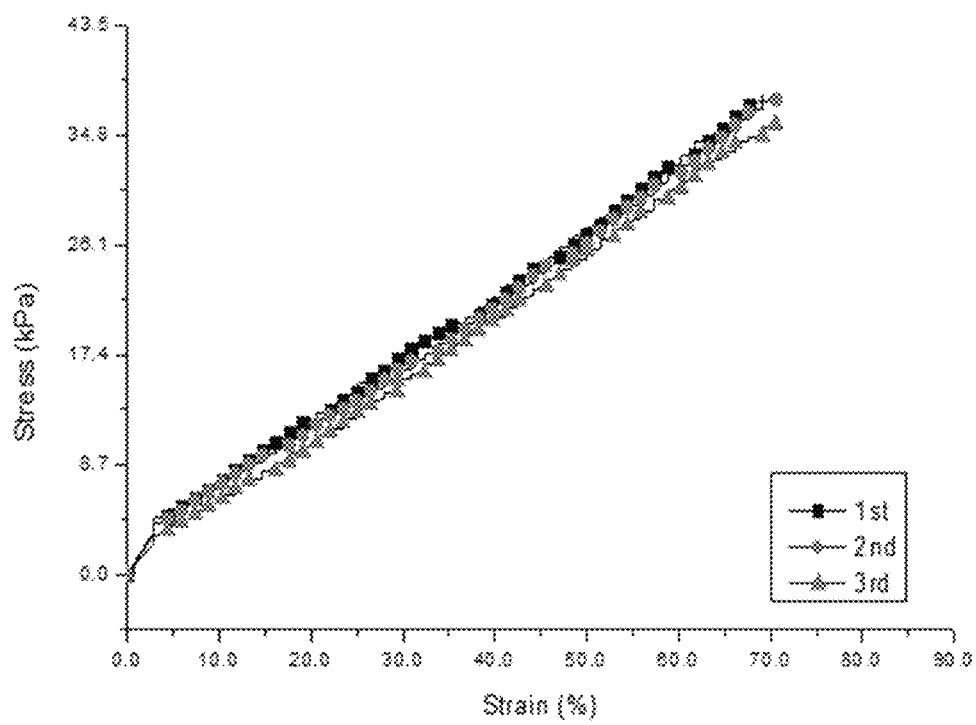
FIGS. 9 and 10 are graphs showing that there is no change in sensitivity before and after applying high pressure, with a stability test for mechanical stimulation of a sensor including the electrode structural body according to Example 1.
Figure 10:
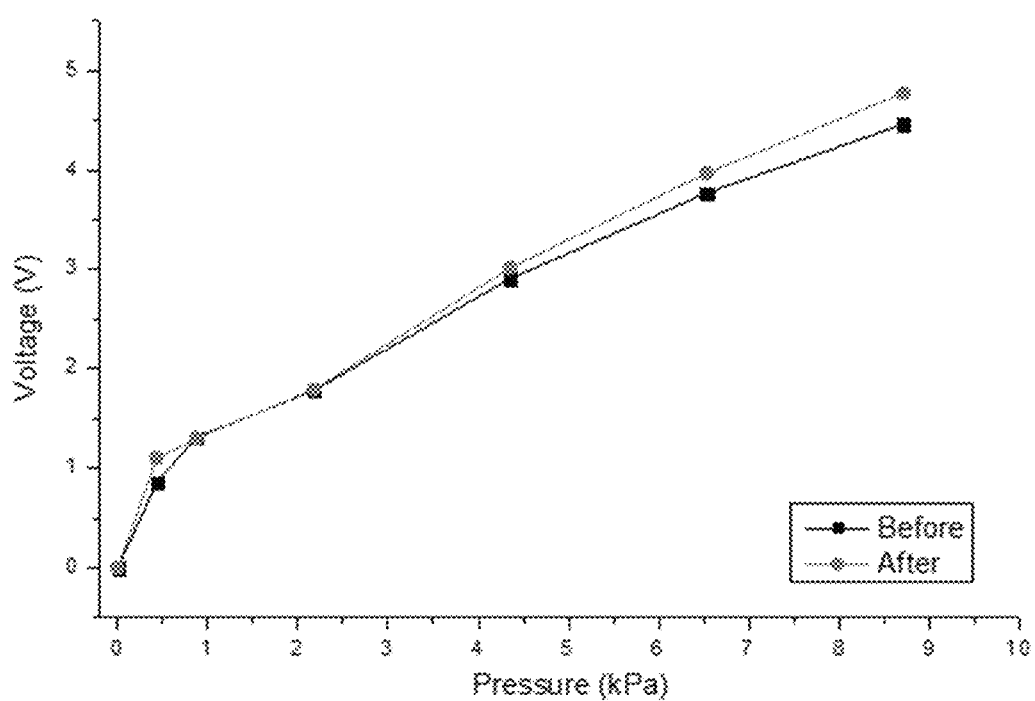

Referring to FIGS. 9 and 10, it was confirmed that even when high mechanical stimulation such as a strain of about 70% or more or a pressure of about 9 kPa or more was applied, the sensitivity of the sensor was maintained without significant difference from the initial. That is, the electrode structural body according to an exemplary embodiment of the present invention is manufactured in an embedding manner to maintain the sensitivity even at high mechanical stimulation, and thus, has high mechanical and chemical stability.

<Experimental Example 3> Analysis of Performance of Friction Power Generation Type Sensor Voltages generated when the electrode according to Example 1 or the electrode according to Comparative Example 1 was applied to the friction power generation type sensor and stimulation was applied for a certain period of time were compared.

Figure 11:
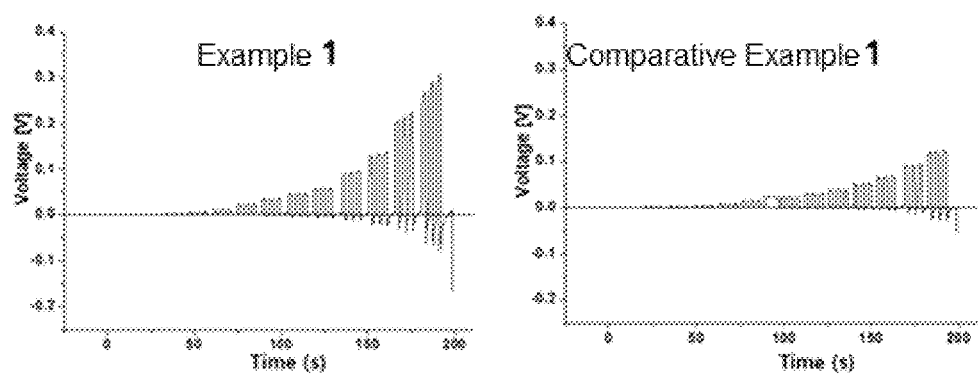
FIGS. 11 and 12 are graphs showing voltage occurring when a constant pressure was applied to a friction power generation type sensor including the electrode structural bodies according to Example 1 and Comparative Example 1.

As seen from FIG. 11, it was confirmed that when stimulation was applied to the electrode according to Example 1, the amount of voltage generated was significantly increased for the same stimulation and the same period of time, as compared with the electrode according to Comparative Example 1.

Figure 12:
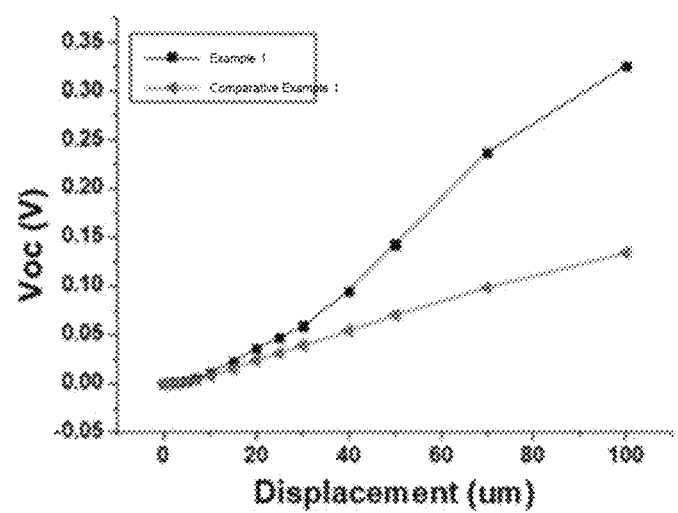

That is, when the experiment results are summarized, as seen from FIG. 12, it was confirmed that the sensitivity of the electrode according to Example 1 for the generated voltage responding to the pressure (displacement) was larger than that of the electrode according to Comparative Example 1.

Figure 13:
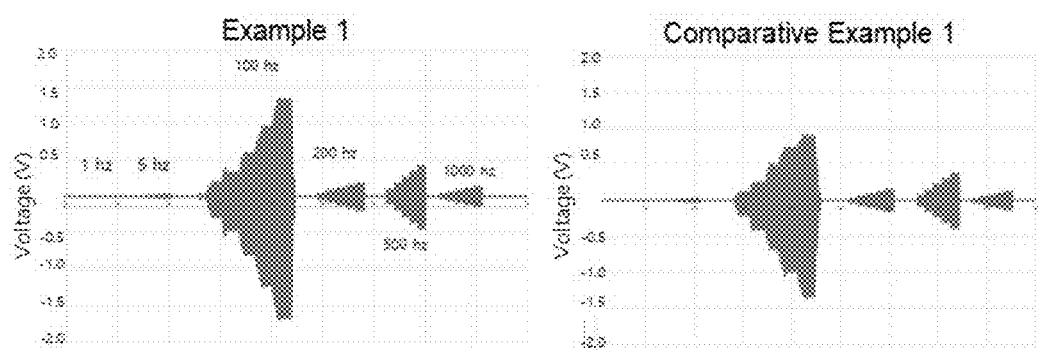
FIG. 13 is a graph showing voltage occurring when a constant frequency stimulation was applied to a friction power generation type sensor including the electrode structural bodies according to Example 1 and Comparative Example 1.

In addition, as seen from FIG. 13, it was confirmed that the electrode according to Example 1 showed higher pressure sensitivity outputs than the electrode according to Comparative Example 1 even at a high frequency in a low pressure range.

Next, tunability in a paired electrode structure and a single electrode structure was observed based on various types of charging pairs in the friction power generation type pressure sensor including the indwelling electrode structural body according to Example 2.

Figure 14:
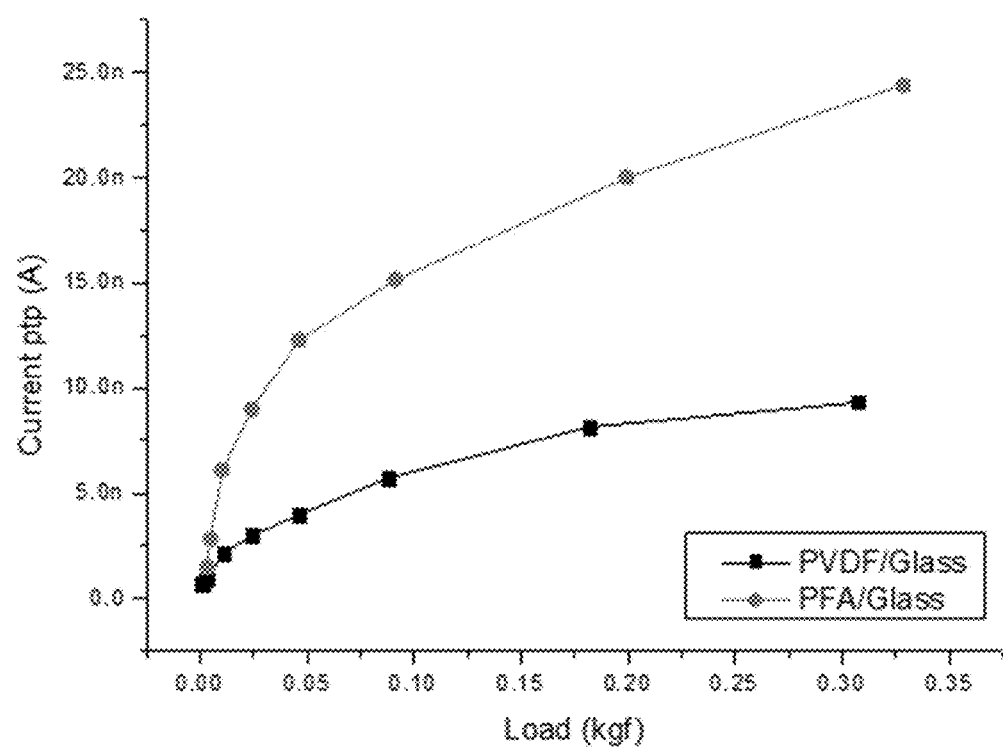
FIG. 14 is a graph showing that when a test for pressure was performed on a friction power generation type sensor including the electrode structural body according to Example 2 with two different types of films having different charging characteristics, an electrical output may be adjusted.

Referring to FIG. 14, it was confirmed that a tunable electrical output was shown depending on the kind of the conductor or the surface layer. That is, by adjusting the surface layer in the friction power generation type pressure sensor, it may be adjusted to get the highest electrical output when human skin is touched, or the highest output may be produced in a structure in contact with clothes such as fabrics.

<Experimental Example 4> Analysis of Performance of Capacitance Type Sensor

Voltages generated when the electrode according to Example 1 or the electrode according to Comparative Example 1 was applied to the capacitance type sensor and stimulation was applied for a certain period of time were compared.

Figure 15:
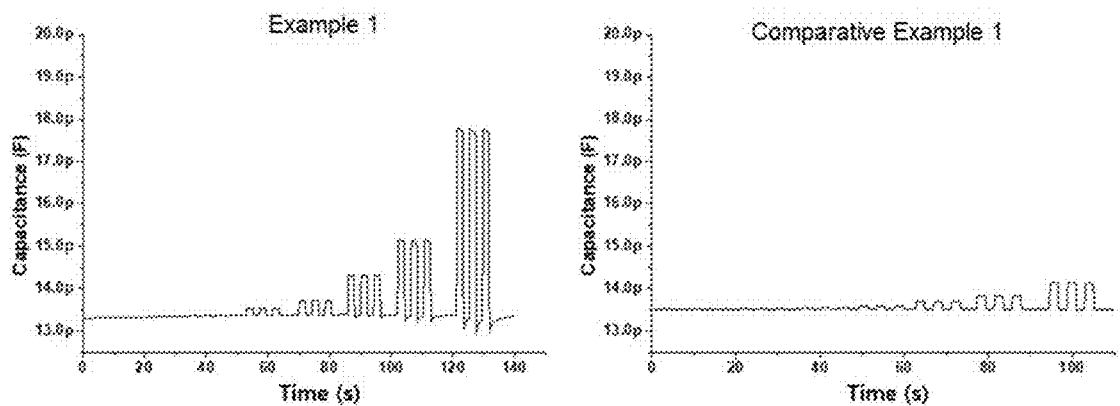
FIGS. 15 and 16 are graphs showing change in capacitance when applying certain pressure to a capacitance type sensor including the electrode structural bodies according to Example 1 and Comparative Example 1.

As seen from FIG. 15, it was confirmed that when stimulation was applied to the electrode according to Example 1, the amount of voltage generated was significantly increased for the same stimulation and the same period of time, as compared with the electrode according to Comparative Example 1.

Figure 16:
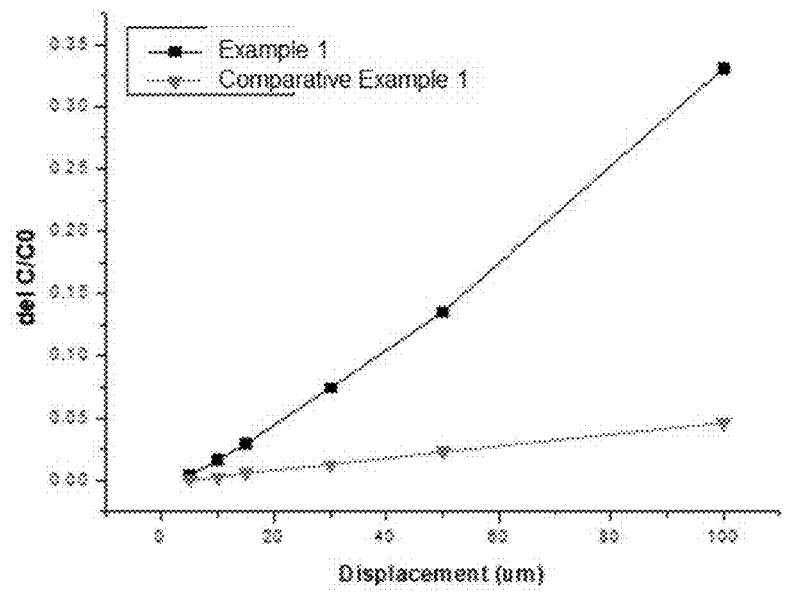

That is, when the experiment results are summarized, as seen from FIG. 16, it was confirmed that the sensitivity of the electrode according to Example 1 for the change in the capacitance responding to the pressure (displacement) was larger than that of the electrode according to Comparative Example 1.

According to the above experimental examples, according to the electrode structural body and the sensor including the same according to the present invention, the electrode is formed along the protruding structure so that the deformation of the protruding structure may be sufficiently sensed, and thus, high sensitivity may be obtained even in a low pressure range.

According to the electrode structural body according to the present invention, an electrode is formed along a protruding structure, so that deformation of the protruding structure may be sufficiently sensed to achieve high sensitivity even in a low pressure range and a polymer layer may be further introduced to the outside of the electrode to achieve excellent stability.

What is claimed is:

1. An electrode structural body comprising:
   a substrate including two or more protruding portions including a first polymer; and
   an electrode layer conformally positioned along a surface of the two or more protruding portions,
   wherein a spacing between the adjacent protruding portions is 100 µm or more.

2. The electrode structural body of claim 1, wherein the electrode layer is selected from the group consisting of conductive one-dimensional metal materials, conductive one-dimensional carbon material, conductive two-dimensional metal materials, conductive two-dimensional carbon materials, and conductive polymers.

3. The electrode structural body of claim 1, wherein the electrode layer includes metal nanowires.

4. The electrode structural body of claim 1,
   wherein a surface layer including a second polymer is sequentially positioned on the electrode layer, and
   the electrode layer is embedded in the surface layer and is not exposed to an external environment of the electrode structural body.

5. A pressure sensor comprising the electrode structural body of claim 1.

6. The pressure sensor of claim 5, wherein when the pressure sensor is used as a friction power generation type pressure sensor, an amount of change in power generation voltage depending on a displacement of the pressure sensor moved by pressure is 2 V/mm or more.

* * * * *